(12) United States Patent
Van Klinken

(10) Patent No.: US 7,739,321 B2
(45) Date of Patent: Jun. 15, 2010

(54) METHOD AND ADAPTIVE FILTER FOR PROCESSING A SEQUENCE OF INPUT DATA

(75) Inventor: Arnond Hendrik Van Klinken, Wolfheze (NL)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 1259 days.

(21) Appl. No.: 11/134,996

(22) Filed: May 23, 2005

(65) Prior Publication Data

US 2005/0261898 A1 Nov. 24, 2005

(30) Foreign Application Priority Data

May 21, 2004 (DE) .................. 10 2004 025 471

(51) Int. Cl.
*G06F 17/10* (2006.01)
(52) U.S. Cl. .................................... 708/322
(58) Field of Classification Search .................. 708/322
See application file for complete search history.

(56) References Cited

U.S. PATENT DOCUMENTS

| | | | | |
|---|---|---|---|---|
| 5,377,276 | A | * | 12/1994 | Terai et al. ............... 381/71.11 |
| 5,610,909 | A | * | 3/1997 | Shaw ......................... 370/291 |
| 5,901,175 | A | * | 5/1999 | Limberg ..................... 375/232 |
| 6,035,312 | A | * | 3/2000 | Hasegawa ................... 708/322 |
| 6,424,683 | B1 | | 7/2002 | Schollhorn |
| 6,496,546 | B1 | | 12/2002 | Allpress et al. |
| 6,895,232 | B2 | | 5/2005 | Parker |
| 7,466,777 | B2 | | 12/2008 | Muhammad et al. |
| 2002/0191688 | A1 | | 12/2002 | De Clippel ................. 375/232 |
| 2008/0318538 | A1 | | 12/2008 | Suominen |

FOREIGN PATENT DOCUMENTS

| | | |
|---|---|---|
| EP | 0696 854 | 2/1996 |
| WO | WO 99/53660 | 10/1999 |

OTHER PUBLICATIONS

Yeh et al. "An Efficient Implementation of Forward-Backward Least-Mean-Square Adaptive Line Enhancers", TDA Progress Report 42-121, pp. 16-26, May 1995.

(Continued)

*Primary Examiner*—Tan V Mai
(74) *Attorney, Agent, or Firm*—DLA Piper LLP (US)

(57) ABSTRACT

An adaptive filter that processes a sequence of input data includes a backward-looking predictive filter, which responsive to the input data and predictive filters the input data using a first set of filter tap weights and provides first predictive filtered data indicative thereof. A first delay device delays the input data for a first period of time and provides a first delayed input data. A forward-looking predictive filter is responsive to the first delayed input data, and predictive filters the delayed input data using a second set of filter tap weights that are the complex-conjugate of the first set of filter tap weights, and provides second predictive filtered data indicative thereof. An adder sums the first predictive filtered data together with the second predictive filtered data and provides output data indicative thereof.

20 Claims, 4 Drawing Sheets

OTHER PUBLICATIONS

Farhang-Boroujeny et al. "Block Implementation of Forward-Backward Line Enhancer", Electronic Letters, vol. 27, No. 9, pp. 728-729, Apr. 1991.

Lim et al. "Forward-Backward LMS Adaptive Line Enhancer", IEEE Transactions on Circuits and Systems, vol. 37, No. 7, pp. 936-940, Jul. 1990.

James R. Zeidler "Performance Analysis of LMS Adaptive Prediction Filters", Proceedings of the IEEE, vol. 78, No. 12, pp. 1781-1806, Dec. 1990.

Zeidler et al., "Adaptive Enhancement of Multiple Sinusoids in Uncorrelated Noise", IEEE Transactions on Acoustics, Speech, and Signal Processing, vol. ASSP-26, No. 3, pp. 240-254, Jun. 1978.

Ashok K. Gupta "On Suppression of a Sinusoidal Signal in Broad-Band Noise", IEEE Transactions on Acoustics, Speech, and Signal Processing, vol. ASSP-33, No. 4, pp. 1024-1026, Aug. 1985.

Tufts et al., "Estimation of Frequencies of Multiple Sinusoids: Making Linear Prediction Perform Like Maximum Likelihood," Proceedings of the IEEE, vol. 70, No. 9, Sep. 1982, pp. 975-989.

C. Therrien, "Some Observations about Centralized Linear Prediction," IEEE Conference on Signals, Systems, and Computers, vol. 1, Oct. 24, 1999, pp. 466-469.

Simon Haykin, "Adaptive Filter Theory," Prentice Hall, 1986, pp. 122-193.

Choi et al, "Adaptive Line Enhancer With Self-Tuning Prefilter," pp. 1-4, Communication & Signal Processing Lab., Division of Electronic and Computer Engineering, Pohang University of Science and Technology, 2003.

Rusch, "Interference Suppression in Spread Spectrum Code Division Multiple Access Communications," Dept. Electrical Engineering, Princeton University, one-page—Abstract.

Rusch, "Interference Suppression in Spread Spectrum Code Division Multiple Access Communications," Dept. of Electrical Engineering, Princeton University, (1994) pp. 1-175.

* cited by examiner

METHOD AND ADAPTIVE FILTER FOR PROCESSING A SEQUENCE OF INPUT DATA

PRIORITY INFORMATION

This application claims priority from German patent application DE 10 2004 025 471.0 filed May 21, 2004.

BACKGROUND OF THE INVENTION

The invention relates in general to signal data processing and in particular to processing a sequence of input data for a audio system.

In the field of transmission of signals for a digital television system, data from different data sequences are assigned to individual channels. Each channel is assigned a transmission frequency or frequency band. Due to relatively scarce frequency resources, the individual channels are situated close to each other, which leads to superpositioning of signals or signal components, especially with respect to the sequences of input data for a receiver. Problems arise in particular with regard to an efficient use of a linear-phase adaptive filter or a filtering method for static data with white noise superimposed on it. Known filters and filtering methods for processing data or signals with multiple sinusoidal signal components of static or slowly changing frequency in an environment with white noise do not offer satisfactory results. This holds especially for the use of an adaptive compensation filter, known as an adaptive line enhancer ("ALE"), for the channel evaluation of pilot-based orthogonal frequency division multiplex ("OFDM") systems.

The problem of suppression of noise on sinusoidal measurement data without knowledge of its content or frequency distribution is generally handled by a form of prediction. Usually an adaptive linear prediction is carried out, making use of an ALE. Most such adaptive filters are used to correct a single narrow-band signal in broad-band noise. However, adaptive filters are also known for correction of multiple repeatedly superimposed narrow-band signals.

To eliminate the noise, these adaptive filters use pure forward-looking prediction devices or prediction filters, for example a forward linear predictor ("FLP"). The taps or parameters of all these devices are individually adjusted and optimized. Both these forward-looking prediction filters and also backward-looking prediction filters, for example a backward linear predictor ("BLP"), have the drawback that they cannot guarantee any linearity of the phase. In general, they develop minimum-phase or maximum-phase tap set solutions, which minimizes their prediction error. One thus achieves the criterion of the minimal "Wiener Hopf" error, which means that important parts of the developed response or the corrected spectral lines have a linear in-phase behavior when compared with the original signal, i.e., the input signal.

The principles are described in Simon Haykin, *Adaptive Filter Theory*, 4$^{th}$ ed., 2002, Prentice Hall, Chapter 3 (Linear Prediction), Section 5.3 (ALEs), and in *Interference Suppression In Spread Spectrum Code Division Multiple Access Communications*, (Rusch, L. A.), 1994, Department of Electrical of Engineering, Princeton University. In the latter the system output values are not a prediction in itself, but rather the error of a prediction, to detect an interference but not to detect a signal.

Such adaptive filters are generally known from European patent application EP 1334554 and corresponding U.S. published patent application US 2002191688, which relate to a lattice predictive filter implemented by a noise subtraction using a notch filter.

There have also been a number of technical articles on this subject. For example, *Adaptive Enhancement of Multiple Sinusoids in Uncorrelated Noise*, Zeidler J. R., et al., 1978, IEEE Trans. Acous. Speech Signal Process, Vol. ASSP-26, pp. 240-254, deals with forward-looking adaptive predictive filters in a general survey article. Bi-directional Wiener filters are described in *Performance Analysis of LMS Adaptive Prediction Filters*, Zeidler, J. R., 1990, Proc. IEEE, Vol. 78, pp. 1781-1806.

It is known to use two coupled predictive devices in a double forward cascade layout, where the dependent device, or slave prefilter, ultimately converges to an IIR solution. This is inconvenient for finite data sets, but effective for individual continuous sinusoidal frequency adjustments that change slowly in terms of frequency, from *Adaptive Line Enhancer with Self Tuning Prefilter*, Coi, Y. S., Shin, H. C., Song, W. J., 2003, Communication & Signal Processing Lab., Division of Electronic and Computer Engineering, Pohang University, Korea.

*An Efficient Implementation of Forward-Backward Least-Mean-Square Adaptive Line Enhancers*, Yeh, H. G., Nguyen, T. M., 1995, TDA Progress Report 42-121 merely describes a forward-looking and backward-looking determination of a predictive error to improve the convergence behavior in conjunction with individual predictive filtering. The quality benefit of the tap adjustment, however, may impair the capability of a single predictor when the tap update rate is much less than the tap/error accumulation rate.

*Block Implementation of Forward Backward Line Enhancer*, Farhang-Boroujeny, B. Lim, Y. C., 1991, describes the use of forward-looking and backward-looking error determinations to improve the convergence.

*Forward-Backward LMS Adaptive Line Enhancer*, Lim, Y. C. Ko, C. C., IEEE Trans, 1990, CAS-37, pp. 936-940 describes an adaptive prediction algorithm. This uses forward-looking and backward-looking prediction errors to update the coefficient values. For a given feedback factor, the algorithm converges on the optimal Wiener solution with the same speed as that of the LMS algorithm, but it requires twice the number of multiplications and additions. However, if the order of magnitude of the prediction filter is at least slightly larger than the number of sinusoids being corrected, or if the frequencies of the sinusoidal signal components being corrected do not lie close to 0 or 0.5, this algorithm leads to only half the size of the adjustment error as the LMS algorithm. Thus, it is evidently an individual prediction filter that uses forward-looking and backward-looking errors to improve the convergence behavior. A bi-directional Wiener filter for suppression is generally known from Gupta, A. K., *On Suppression of Sinusoidal in Broadband Noise*, IEEE Trans. Acoustics, Speech and Signal Processing, Vol. ASSP-33, pp. 1024-1026, August 1985.

The drawback to the known solutions is that the linear prediction filters all use individually adaptable taps, i.e., not dependent taps, which are all coordinated with minimum-phase or maximum-phase systems. All single predictors have asymmetrical behavior at the two ends of input data sequences with a limited length. The fact that multiple sinusoidal signal components can be predicted backward and forward is merely used to improve the convergence behavior and to correct a tap misadjustment in the converged state. But the use of forward-looking and backward-looking error components for the tap misadjustment does not offer much improvement to the convergence and the misadjustment when the tap update rate is substantially less than the tap error accumulation rate divided by the order of magnitude or length of the prediction filter. In this case, the advantage in tap adjustment quality from using both prediction errors is sacrificed and results in deterioration of the measure of an adaptive single predictive filter.

What is needed is an improved method and adaptive filter for processing a sequence of input data for a radio system.

SUMMARY OF THE INVENTION

Accordingly, a method using an adaptive filter for processing a sequence of input data for an audio system may have the input data provided to first and second predictive filters, and the data may be delayed in time before or after the second predictive filter. One of the first and second predictive filters may be backward-looking while the other predictive filter may be forward-looking, and the data filtered by the first and the second predictive filters may be added together to yield the output data.

A corresponding adaptive filter for processing a sequence of input data for an audio system may include an input for entering the sequence of input data to both a backward-looking predictive filter and a forward-looking predictive filter. A delay may also be included that delays the data before or after the second predictive filter, and an adder may be connected to the output of each predictive filter to add these predicted data together and provide the added data as the output data.

The input data may be delayed by a second delay, which may be less than the first delay, and the resulting delayed data may be used in the determination of a prediction error signal. The prediction error signal may be determined by subtracting the data filtered by the first predictive filter from the input data delayed by the second delay and by providing the resulting data to the first predictive filter, and by subtracting the data filtered by the second predictive filter from the input data delayed by the second delay and by providing the resulting data to the second predictive filter.

Alternatively, the prediction error signal may be determined by subtracting the output data from the input data delayed by the second delay. The prediction error signal may be provided to the first and second predictive filters. The prediction error signal may be provided to the first predictive filter for its adaptive control with tap values, and complex conjugated tap values may be provided to the second predictive filter for its adaptive control. The input data delayed by the second delay may be subjected to an indirect center tap control which receives tap values or complex-conjugated tap values of the first predictive filter as the control signal, and the output values of the center tap control may be added to the data filtered by the two predictive filters.

The input data delayed by the second delay may be added to the data filtered by the two prediction filters.

The first and/or the second delay may be attuned so that a data prediction is generated and output with the same group delay for data over the various data processing pathways.

The data from a received signal with multiple signal components of static or quasi-static or slowly varying frequency may be used as the input data, in particular, the input data of a digital OFDM television signal.

The filter may have a delay device for delaying the data such that all the components, in particular the predictive filters, output a data prediction with the same group delay.

The filter may have an additional delay device configured and actuated to provide a prediction error signal.

The filter may have the additional delay device connected to an input of a subtractor, whose output is connected to a control input of the first predictive filter, and a subtraction input of the subtractor may be connected to the output of the adder or to the first predictive filter. The first predictive filter may use adaptive tap values and the second predictive filter may use complex-conjugated copies of these tap values. The additional delay device may be connected to the subtractor, whose output is connected to a control input of the second predictive filter, and a subtraction input of the subtractor may be connected to the output of the adder.

The filter may have the additional delay device connected to an input of a subtractor, whose output may be connected to control inputs of the first and second predictive filters, and a subtraction input of the subtractor may be connected to the output of the adder.

The filter may have the additional delay device connected to a controlled center tap device, whose output may be further connected to the adder. The filter may have the center tap device with a control input connected to a control output of the first predictive filter. The center tap device may be configured to perform real-value computations.

The filter may have a control input of the second predictive filter connected to a control output of the first predictive filter.

The filter may have the components configured and actuated so that the filter frequency response has a linear phase.

The filter may process a received signal with multiple sinusoidal components of static or quasi-static or slowly varying frequency, in particular a digital OFDM television signal.

These and other objects, features and advantages of the present invention will become more apparent in light of the following detailed description of preferred embodiments thereof, as illustrated in the accompanying drawings.

BRIEF DECRIPTION OF THE DRAWINGS

DETAILED DESCRIPTION OF THE INVENTION

Figure 1:
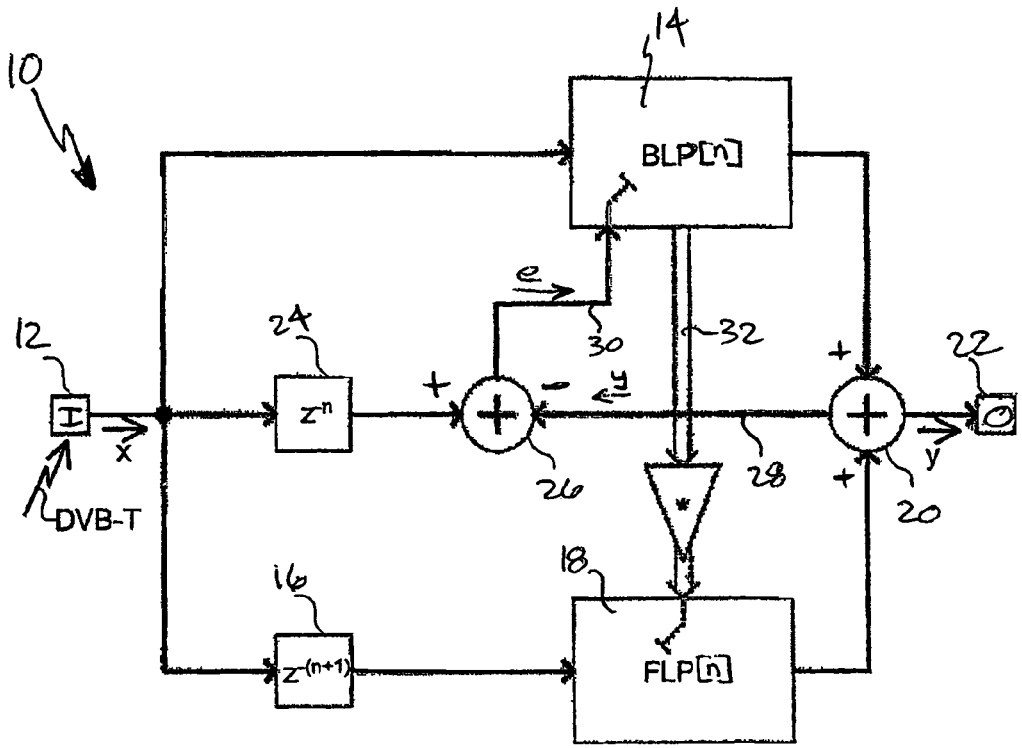
FIG. 1 is a block diagram illustration of a first embodiment of a predictive filter.

The following embodiments describe and illustrate an adaptive predictive filter also known as an adaptive line enhancer ("ALE"), and a corresponding method. In particular, a channel estimation may be performed for a sequence of input data x, which may involve input data of a pilot-based OFDM system. An improvement may be achieved for static data or data varying slowly or quasi-statically in terms of frequency, when the input data are superimposed with white noise or a perturbing influence from neighboring channels similar in effect to white noise. A symmetrical arrangement having a first and a second predictive filter may be utilized, the first filter being backward-looking and the second filter being forward-looking.

For example, the filter may be used to improve the channel estimation of a receiver, for example a Debug Receive Data Digital Video Broadcasting-Television ("DRXD DVB-T") receiver. The input data for such a receiver may be the desired data for a communication channel that are impaired by a limited number of echoes, due to different signal pathways between the sender and the receiver, so that the communication channel corresponds to a channel transfer function having a limited number of complex, multiply-superimposed sinusoidal signal components. Thus, when a measurement of the channel transfer function is performed as a time series, the estimation of the resulting channel transfer function can be significantly improved by improving the limited number of spectral lines of these time series.

The filter may be able to correct real-valued or complex-valued data with white noise superimposed on it. The correction may be relatively good when the input data have good autocorrelation properties over a rather long time delay, i.e., they are limited or even discrete in terms of frequency.

The filter may be formed by the added output values of two predictive filters, a first, backward-looking linear predictive filter and a second, forward-looking linear predictive filter, both of them receiving the input signal. The second predictive filter may receive the input signal delayed in time relative to the first predictive filter. Equivalent to this is a corresponding time delay of the value output, according to a plurality of embodiments described hereafter. The incoming delay at the input of the second, forward-looking predictive filter may occur in such a way that the sampled values predicted in the forward direction are output with the same group delay as the backward predicted sampled values. As an option, an adaptive middle tap or center tap may also be provided, whose output value may also be added to the data sequence being output.

At least one of the predictive filters may have a set of adaptive taps. The other predictive filter may use a complex-conjugated copy of this set of taps. The overall resulting filter may have a Hermitian symmetrical set of taps about the center tap. The adaptive taps may be controlled directly by an algorithm that reduces the prediction error of the overall filter. A Hermitian symmetrical set of taps may be used to achieve a linear-phase behavior of the filter.

Regarding the complexity of the tap adjustment for an individual linear predictive filter, the combined adaptive filter may enable twice the reduction in noise power as compared to an individual predictive filter of the same size. Furthermore, the computational expense may be less than that for an individual adaptive predictive filter of twice the size to achieve the same capability. Moreover, the symmetrical set of taps of both predictive filters may facilitate efficient implementation of both predictive filters in a combined architecture.

The adaptive filter may be built from a linear-phase system. The filter may exhibit a symmetrical behavior at the two ends of input data sequences of finite length. The fact that multiple sinusoidal signal components can be predicted forward and backward may be utilized to double the number of taps, so as to reduce the input noise power by half. Misadjustment of taps can be controlled by selecting a smaller adjustment factor. In an application where the speed of the adjustment may be of lesser consequence, a greater noise reduction can be achieved with less computational expense. In cases where the setting or adjusting rate of the taps may be substantially less than the tap error correlation accumulation rate divided by the order of magnitude or length of the predictive filter, such as a DRXD application, the tap updating may exhibit asymptotically a similar or identical statistical behavior (apart from a scaling factor) to that of FBLE/FBLMS algorithms. Even where the FBLE/FBLMS algorithms may be worse in terms of capability than an individual predictive filter, the symmetrical filter may still cut the noise in half as compared to FBLE/FBLMS algorithms, and do so with a comparable computational expense.

Referring to FIG. 1, in an embodiment of an adaptive filter 10, which can also be termed a resonator, a sequence of input data x may be entered at an input, I, 12. These input data x may, for example, be provided by a remote transmitter of a terrestrial digital television system, e.g., per DVB-T, and have been sent via a radio interface. The input data x at the input 12 may be connected to a first, backward-looking predictive filter, BLP[n], 14. The input data x may also be connected across a delay device 16 to an input of a second, forward-looking predictive filter, FLP[n], 18. As such, the input data are presented at the second predictive filter 18 delayed in time by a first delay step $z^{-(n+1)}$, where the delay occurs every n+1 clock cycles.

The two predictive filters 14, 18 may predict a desired sequence of data y output from the adaptive filter 10, which output data y desirably corresponds as much as possible to the input data x originally sent by the transmitter. The two sequences of predicted data, output by the first and second predictive filters 14, 18, may be input to an adder 20, and the resultant sum is output on a line 22 as the resulting predicted sequence of data y. The time delay of the delay device 16 may be chosen such that each time the predicted data of the first and second predictive filters 14, 18, corresponding to the same original data being reconstructed or predicted, are presented at the same time to the adder 20 to be added together.

The input data x may also be connected across a second delay device 24 to an adding input of a subtractor 26. As such, the subtractor 26 is presented with the input data x having a second delay $z^{-n}$ which may be shorter than the delay $z^{-(n+1)}$ of the first delay device 16. The second delay $z^{-n}$ may correspond to the filter length n of the first and the second predictive filters 14, 18. A second, subtracting input of the subtractor 26 may receive the output data y from the adder 20 on a line 28. This way, the output data y output are subtracted from the input data x delayed by the second time delay $z^{-n}$. The output of the subtractor 26 may be a signal or data sequence provided as the prediction error signal e on a line 30 to a control input of the first, backward-looking predictive filter 14. The prediction error signal e on the line 30 may be used to actuate corresponding taps of the first predictive filter 14.

The second, forward-looking predictive filter 18 may use corresponding taps with values complex-conjugated to the taps of the first predictive filter 14. The prediction error signal e from the subtractor 26 may optionally be sent to a control input of the second predictive filter 18. However, the complex-conjugated sampled values may be fed on a line 32 from the first predictive filter 14 to the control input of the second predictive filter 18.

Thus, some of the components of this embodiment of the adaptive filter 10 are a first, linear backward-looking predictive filter BLP[n] 14, a data delay device 16, a second, linear forward-looking predictive filter FLP[n] 18, and an adder 20. All of these components may work on the original input data x or the original input data x delayed by a time delay $z^{-(n+1)}$ and may be controlled such that the predicted data output by the predictive filters 14, 18 may be added together with the same group delay. The second delay device 24 may be used to produce a prediction error e and can at the same time also furnish the input of the second predictive filter 18 with a corresponding control signal or corresponding values.

The description and illustration of this and other embodiments includes individual structural components. However, the various functions can also be implemented by a single structural component, for example, an integrated circuit chip or processor. Registers may be used instead of the delay devices 16, 24, the individual data values of the registers may be tapped accordingly and fed to additional components.

Figure 2:
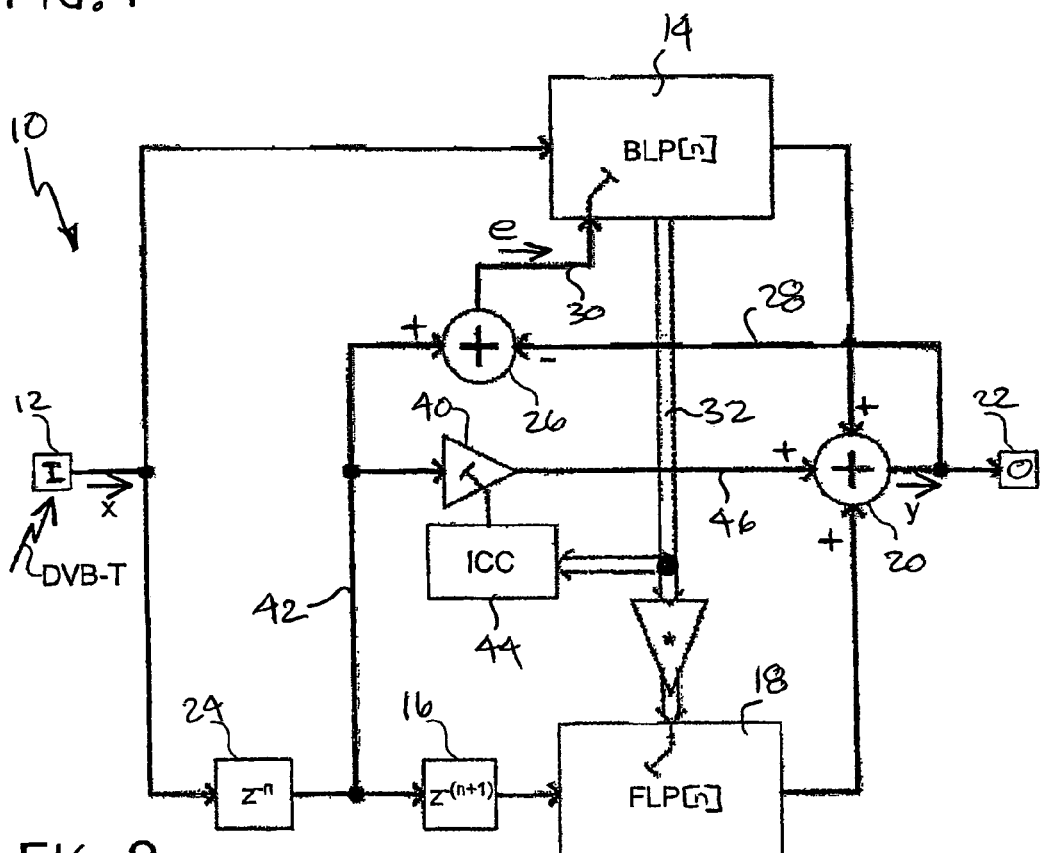
FIG. 2 is a block diagram illustration of a second embodiment of a predictive filter.

Referring to FIG. 2, another embodiment of the adaptive filter 10 may include a middle or center tap 40. The input data x may be provided to two serially-connected delay devices 24, 16, where the first delay device 24 corresponds to the additional delay device 24 in FIG. 1 with a second time delay $z^{-n}$. The output of the first delay device 24 may be provided to both the subtractor 26 and the second delay device 16. The second delay device 16 may perform an additional delay $z^{-(n+1)}$ and output the input data x with the time delay $z^{-(n+1)}$ similar to the first delay device 16 of FIG. 1 to the second, forward-looking predictive filter FLP[n] 18. Accordingly, two consecutive delay devices 24, 16 may be utilized, with a tap 40 between them, instead of the two parallel connected delay devices 16, 24 of FIG. 1.

The input data x with the lesser delay $z^{-n}$ may also be provided on a line 42 to an input of the center tap 40. The center tap 40 receives a control signal or corresponding data values from an indirect center tap controller (ICC) 44. The ICC 44 may receive, for example, the prediction error signal e directly from the subtractor 26, or the ICC 44 may receive the tap values or the complex-conjugated tap values of the first, backward-looking predictive filter BLP[n] 14 on the line 32. The center tap output may be provided on a line 46 to an additional adding input of the adder 20. This way the center tap output data may be added together with the data predicted and output by the two predictive filters 14, 18 with a corresponding time delay, to produce the output data y at the output 22 of the adaptive filter 10.

For complex-valued input signals or input data x, complex-valued taps may be used in both the first and second prediction filters 14, 18, whereas the optional center tap 40 may be set for real values. Furthermore, adaptive taps or tap values may be used in at least one of the linear predictive filters 14, 18. The other predictive filter may then use complex-conjugated copies of those taps. The adapting of the predictive filter tap values may be performed by a algorithm which adapts each tap value by reducing the part of the prediction error that was caused by the wrongly adjusted or misadjusted tap in the overall resonator output value. The practical implementation may be a Least Mean Square ("LMS") algorithm. However, other tap adapting algorithms can also be used, such as RLS. As a further option, the center tap 40 can be set adaptively. The center tap 40 may be adapted by an indirect adaptation algorithm that is based on the values of the other taps. As an alternative, all of the taps or tap values can be adapted in common by a more elaborate algorithm.

The summed output values of both predictive filters 14, 18 and the center tap device 40 may be large Finite Impulse Response ("FIR") filters, having a Hermitian symmetrical tap set about the center tap. This ensures that the adaptive filter 10 has linear-phase properties. At the same time, the adaptive filter 10 with its complex-valued tap sets has an asymmetrical frequency-amplitude response about the 0-frequency.

A feature of the adaptive filter 10 when used for noise reduction is that it is linear with respect to phase for all parts of the frequency response, including the unimportant components. The concatenation of the two predictive filters 14, 18 accomplishes a double reduction of the noise power, while the tap control component has a complexity corresponding to only one adaptive predictive filter. Moreover, the coupled tap sets of the two predictive filters 14, 18 facilitate an efficient hybrid implementation of the two predictive filters 14, 18.

The correct functioning of the adaptive filter 10 can be confirmed by many known properties of linear predictive filters and adaptive line enhancers for detection of sinusoidal signal components. For any given situation, the optimal Wiener/Hopf solution for a backward-looking predictive filter is the Hermitian conjugate of the optimal solution of the forward-looking predictive filter. The backward-looking predictive filter has a group delay of the sample values or data values equal to the order of magnitude of the prediction, while the forward-looking predictive filter on the other hand has a group delay of −1 input sample values or input data values.

Due to a correct delaying of the input data x when provided to the forward-looking predictive filter 18 or a corresponding delaying of their predicted data output, both adaptive forward-looking and adaptive backward-looking predictive filtering may be achieved, whose predicted data have the same delay for each of the same input data values.

Figure 3:
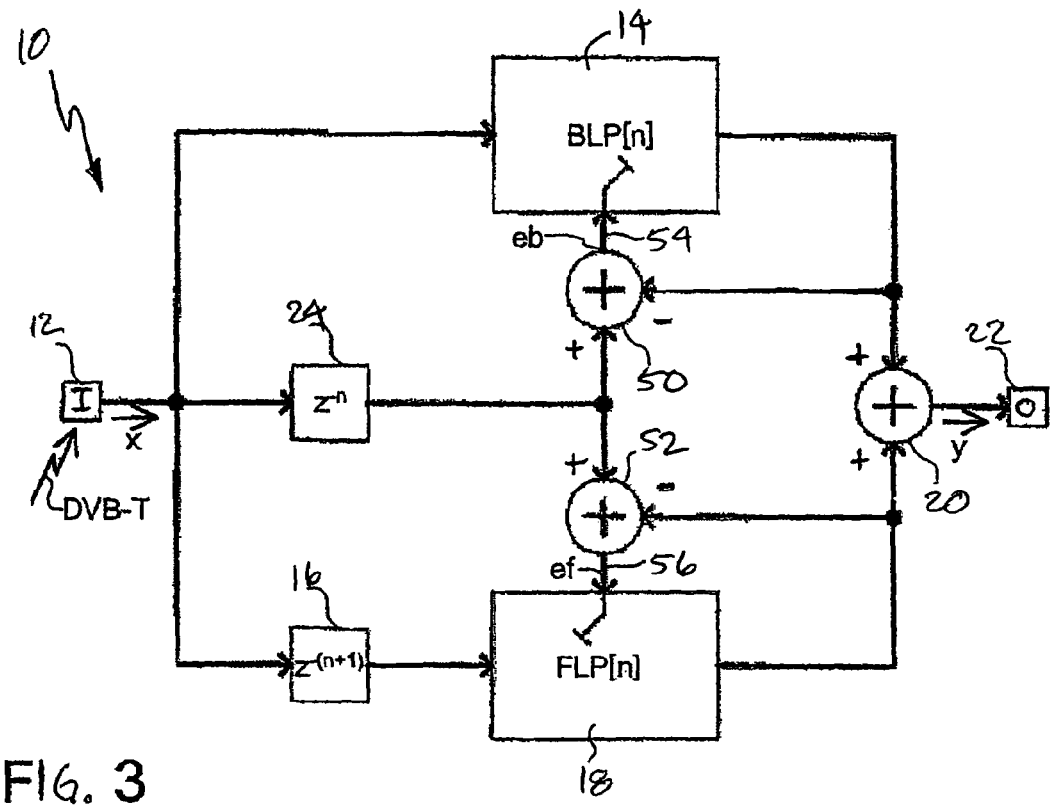
FIG. 3 is a block diagram illustration of a third embodiment of a predictive filter.

Referring to FIG. 3, an embodiment of an adaptive filter 10 may be operated in connection with the optimal Wiener solution for both predictive filters 14, 18. This embodiment may predict at least data sample values with the optimal Wiener solution for the order of magnitude or the filter length L. However, the input noise may be reduced by a factor of two when the end result is compared to a single forward- or backward-looking predictive filter, since 2L different input sample values may be used to create the prediction, instead of only L input sample values.

The input 12 may be connected to the input of the first, backward-looking predictive filter BLP[n] 14, and also may be connected to the input of the second, forward-looking predictive filter FLP[n] 18 across the delay device 16 to produce a delay of $z^{-(n+1)}$. The input may also be connected to an input of the additional delay device 24. The outputs of the two predictive filters 14, 18 may be connected to the adder 20.

In this embodiment, the output of the additional delay device 24 may not be connected to the input of the subtractor 26 as in FIG. 1, but instead may be connected to the inputs of two subtractors 50, 52. The subtracting input of the subtractor 50 may be connected to the output of the first predictive filter 14, and the subtracting input of the second subtractor 52 may be connected to output of the second predictive filter 18, to provide both subtractors 50, 52 with corresponding predicted data. Accordingly, a first prediction error signal eb is formed from the difference of the input data x, delayed by the additional delay $z^{-n}$, minus the corresponding predicted data values of the first, backward-looking predictive filter BLP[n] 14. This first prediction error signal eb is provided on a line 54 to the control input of the first predictive filter 14. Further, a second prediction error ef is formed from the difference of the input data x, delayed by the additional delay $z^{-n}$, minus the corresponding predicted data values of the second, forward-looking predictive filter FLP[n] 18 and provided on a line 56 to the control input of the second predictive filter 18.

To show that the adaptive filter 10 also predicts the output values of the optimal Wiener solution for the order of magnitude of 2L, the optimal Wiener solutions for correction of multiple sinusoidal signal components in white noise may be considered. The theory of adaptive predictive filters, in particular adaptive line enhancers, shows that, given an adequate order of magnitude or length L of the predictive filter, the optimal BLP/FLP Wiener tap solutions themselves also constitute multiply superimposed, but phase-shifted and inverted sinusoids. Assuming that the order of magnitude of the prediction or the prediction length L of the individual adaptive filter or resonator 10 comprising the two coupled predictive filters 14, 18 is dimensioned large enough, then its Hermitian reflected 2L tap set will also equal the optimal Wiener solution with a 2L tap set.

For optimal correction of complex-valued data, the filter 10 should furnish an asymmetrically distributed amplitude response about the 0 frequency. Even if the original data are replaced by the corrected data, possibly combining this data with other data in a further process, the correcting filter frequency response should be linear in terms of phase. In such a case, all data components are output with the same group delay. It is thus possible to combine corrected data with other data without introducing a phase distortion.

Figure 4:
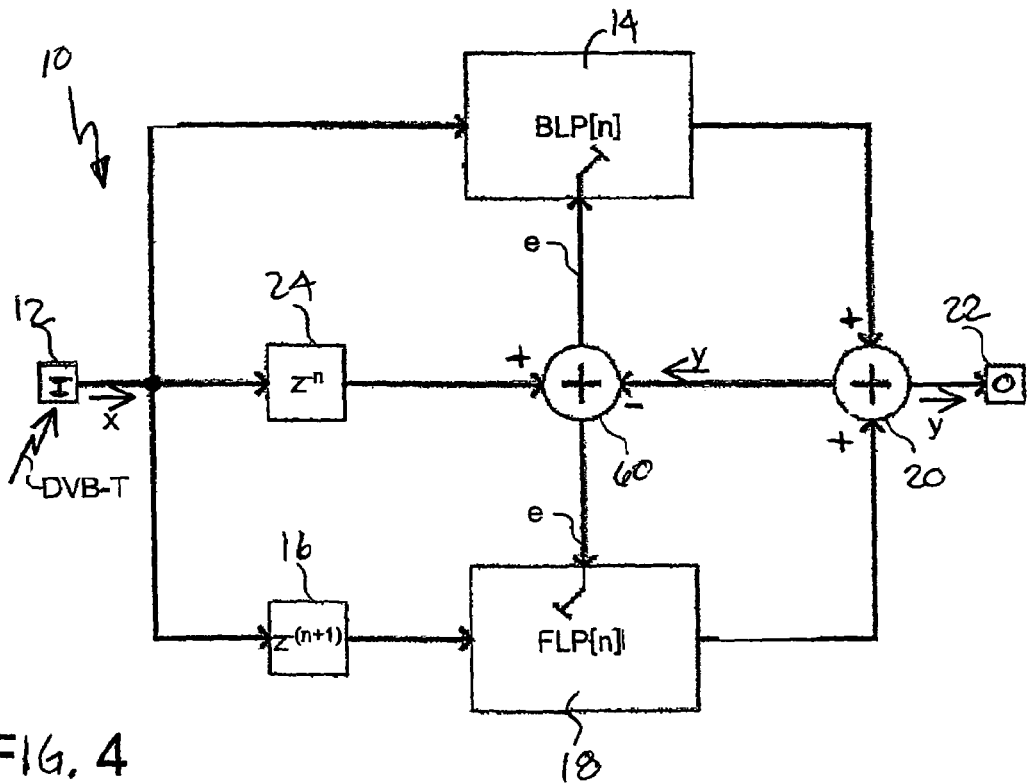
FIG. 4 is a block diagram illustration of a fourth embodiment of a predictive filter.

To show that this applies to the production of the error from the overall filter output, rather than from the output of an individual FLP or BLP predictive filter, the adaptive filter or resonator 10 can be configured with two adaptive predictive filters, as illustrated in FIG. 4. FIG. 4 illustrates a symmetrical 2N-size predictive filter 10 with no center tap, which likewise provides an optimal 2N-Wiener solution and double noise suppression. The difference from the adaptive filter or resonator 10 of FIGS. 1-3 is that the adjusting of the second, forward-looking predictive filter FLP[n] 18 is shifted in time. As compared to FIG. 1, the prediction error signal e output from the subtractor 60 is provided directly to the control inputs of both the backward-looking predictive filter BLP[n] 14 and the forward-looking predictive filter FLP[n] 18. In this case, there is a single adaptive filter 10 without a center tap, which predicts the sinusoids in the central region within the adaptive filter 10. The optimal tap solution for this adaptive line enhancer is the same as for a single-adaptive dependent design, which uses an error from the overall filter output values. The difference from the resonator 10 of the other embodiments, however, is that the tap settings for the dependent predictive filter (slaved predictor) are shifted in time. If a refresh constant $\mu$ is reduced so much that individual tap contributions become increasingly negligible in relation to the developed tap set, this time shift also becomes less significant in the slaved refreshing. Therefore, the behavior of the resonator 10 of FIG. 1 is identical, for low refresh rates and/or low refresh factors $\mu$, to that of a double adaptive predictive filter which uses a center tap, according to the adaptive line enhancer of FIG. 4. Indeed, this can be interpreted as a two-sided adaptive predictive filter with a hard-wired symmetrical tap limitation.

If one adds to the single-type embodiments an adaptive center tap device, its tap cannot be controlled by a direct tap adjustment algorithm using the LMS principle, for example. Even so, as illustrated in FIG. 2, the possibility exists for an indirect adaptive mode of operation, which provides a stable adaptive filter. This is due to the fact that the combined adaptive filter may become singular and attractive for the unitary tap set solution. A filter that may predict the middle or the center of the signal by a unitary center tap and all other taps equal to zero would produce a zero prediction error in every instance, so that no adapting occurs.

It is known from the optimal Wiener adaptive line enhancer solution that its optimal center tap must be the continuation of all of the multiply-superimposed sinusoidal signal components in the surrounding tap set. Thus, this forms the middle of the tap set, and all sinusoidal signal components are multiply-superimposed therewith phase zero. This means that the center tap is real-valued and has the amplitude sum of all sinusoidal signal components that are superimposed in the tap set.

Therefore, if the optimal 2L+1 Hermitian tap set comprises N multiply-superimposed sine curves, the result is:

$$A_{i \in [-L, +L]} = \sum_{k=0 \ldots N-1} \rho_k e^{j, i, \omega_k}$$

This yields the central value of $A_0$.

Even when the signal to noise ratio is high enough so that all sinusoidal signal components entered are to be predicted with a minimal error, the optimal filter will multiply-superimpose them with the same amplitude in its tap set, as given by:

$$\rho_k = \frac{1}{2L+1} \Rightarrow A_0 = \frac{N}{2L+1}$$

Accordingly, the most diverse kinds of indirect methods can be used to set this value $A_0$ close to these sums or to update it. One possible way of setting the middle tap value $A_0$ close to this value is to use the predictive filter itself and make it predict the value of the middle tap according to:

$$A_{0neu} = \sum_{i=L \ldots +L} A_i A_{-i} = A_{0alt}^2 + 2 \sum_{i=1 \ldots L} A_i A_i^*$$

It should be noted that a unitary solution remains singular, so that it is possible to hinder the attraction to the unitary solution when the filter is operating in the vicinity of the optimal solutions for multiple sinusoidal signal components. For example, a satisfactory behavior may be achieved if the central value $A_o$ is set by:

$$A_{0neu} = \frac{2 \sum_{i=1 \ldots L} A_i A_i^*}{(1 - A_{0alt})^2 + 2 \sum_{i=1 \ldots L} A_i A_i^*}.$$

The action of the added center tap becomes significant in noise suppression when the number of different sinusoidal signal components in the input data being corrected comes close to the order of magnitude of an individual forward-looking or backward-looking adaptive predictive filter.

Figure 6:
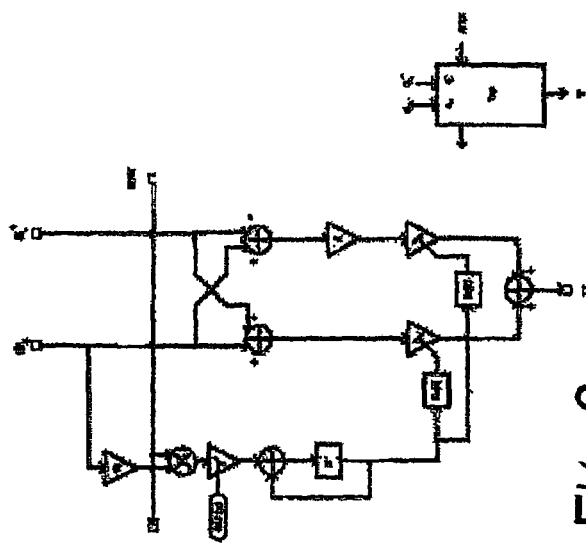
FIG. 6 is a block diagram illustration of a portion of the fifth embodiment of a predictive filter of FIG. 5.
Figure 5:
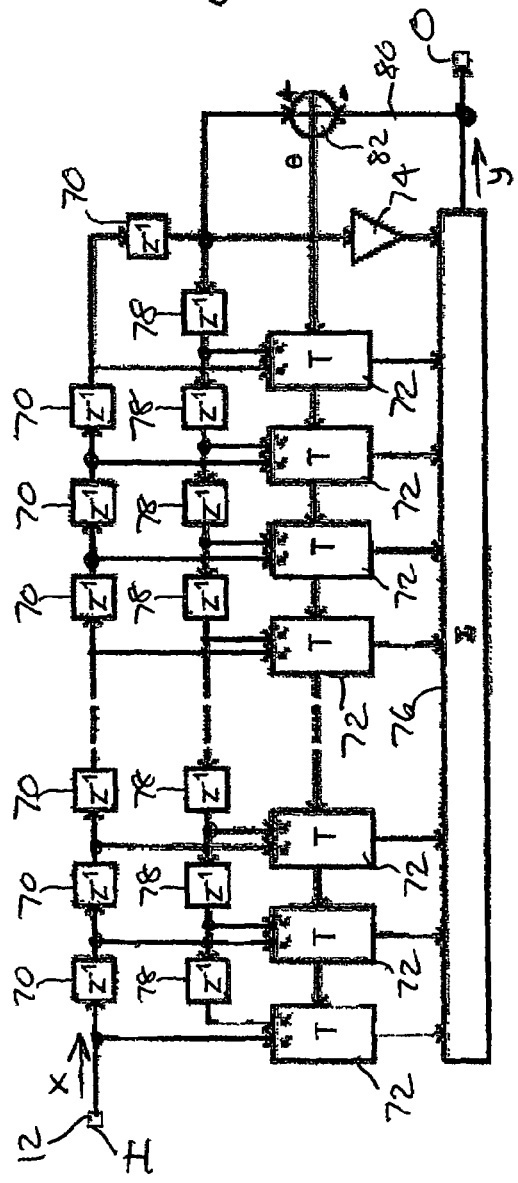
FIG. 5 is a block diagram illustration of a fifth embodiment of a predictive filter.

FIG. 5 illustrates an embodiment with a hybrid forward-looking and backward-looking resonator architecture. From the input 12, the input data x may be provided to a series-connected sequence of delay devices 70, each delay device 70 having a delay $z^{-1}$ of one clock cycle. The current data value may be tapped before and after each of the delay devices 70, and the tapped values may be provided each time to a first input of a tap architecture, T, 72, which is illustrated in greater detail in FIG. 6. The output value of the last of the delay devices 70 may be provided to an amplifier 74, the output of which may be provided to an adder 76. The output value of the last of the delay devices 70 may also be provided to the input of another series-connected sequence of a plurality of additional delay devices 78. At either end of each of these additional delay devices 78 a current data value may be tapped and provided accordingly to a second input of the coordinated tap architectures, T, 72 in reverse sequence. The output values of the tap architectures 72 may be added up in the adder 76. To determine the prediction error signal e, the output value of the last delay device 70 of the first group of delay devices and the output value of the adder 76 on a line 80 are subtracted from each other in a subtractor 82 in accordance with the above described embodiments. The prediction error signal e may be provided to one control input of each of the individual tap architectures 72.

Besides the embodiments described and illustrated herein, there are many alternative design possibilities. For example, each filter may comprise a combination of an adaptive filter and a delayed complex-conjugated transferred slave filter, and the output values of the two may be added with an identical group delay and may have a resultant Hermitian symmetrical pulse response centered about the group delay of the overall filter.

The filter can be expanded by an extra amplifier stage, which is placed at the output. The output gain can be used to improve the behavior at the two end points of a finite data set. To accomplish this, a sequence of incoming and outgoing gain factors can be programmed at the output during the entering or exiting of the data set from the filter.

In addition to the expansion by an extra operational amplifier, the filter can be expanded by a mechanism for reducing symmetrical tap contributions in the filter output. Here as well, an extra output stage can provide a compensation for the tap not presently being used.

Both the output amplifier stage and the tap reduction mechanism can be realized in a DRXD-resonator filter. The linear-phase property of the adaptive filter or resonator makes them especially useful, since any residual resonator error/ predictor error can only be an amplitude error, and not a phase error.

Assuming a static or quasi-static environment, in which the sinusoidal signal components are of constant frequency, the filter offers an advantage as compared to an individual linear predictive filter. Moreover, it is advantageous in terms of computational complexity as compared to a single linear predictive filter with twice the length and comparable capability.

The symmetrical nature of the filter means that it offers a linear-phase behavior at every moment of time. The symmetrical nature of the filter is helpful when processing finite data sets, the behavior at the start of the data set being symmetrical to the behavior at the end of the data set.

The range of applications of such an adaptive filter or resonator is diversified. Any given data or signals, in which multiple sinusoidal signal components of static or slowly changing frequency are present, and which are superimposed with white noise, can not only be detected, but also significantly and efficiently corrected with the filter. A significant decrease in computational expense becomes possible in cases where the frequencies of the sine waves are static enough to justify a very small tap refresh factor and/or a very small tap refresh rate, which are substantially lower than the tap error accumulation rate divided by the prediction order of magnitude.

Figure 7:
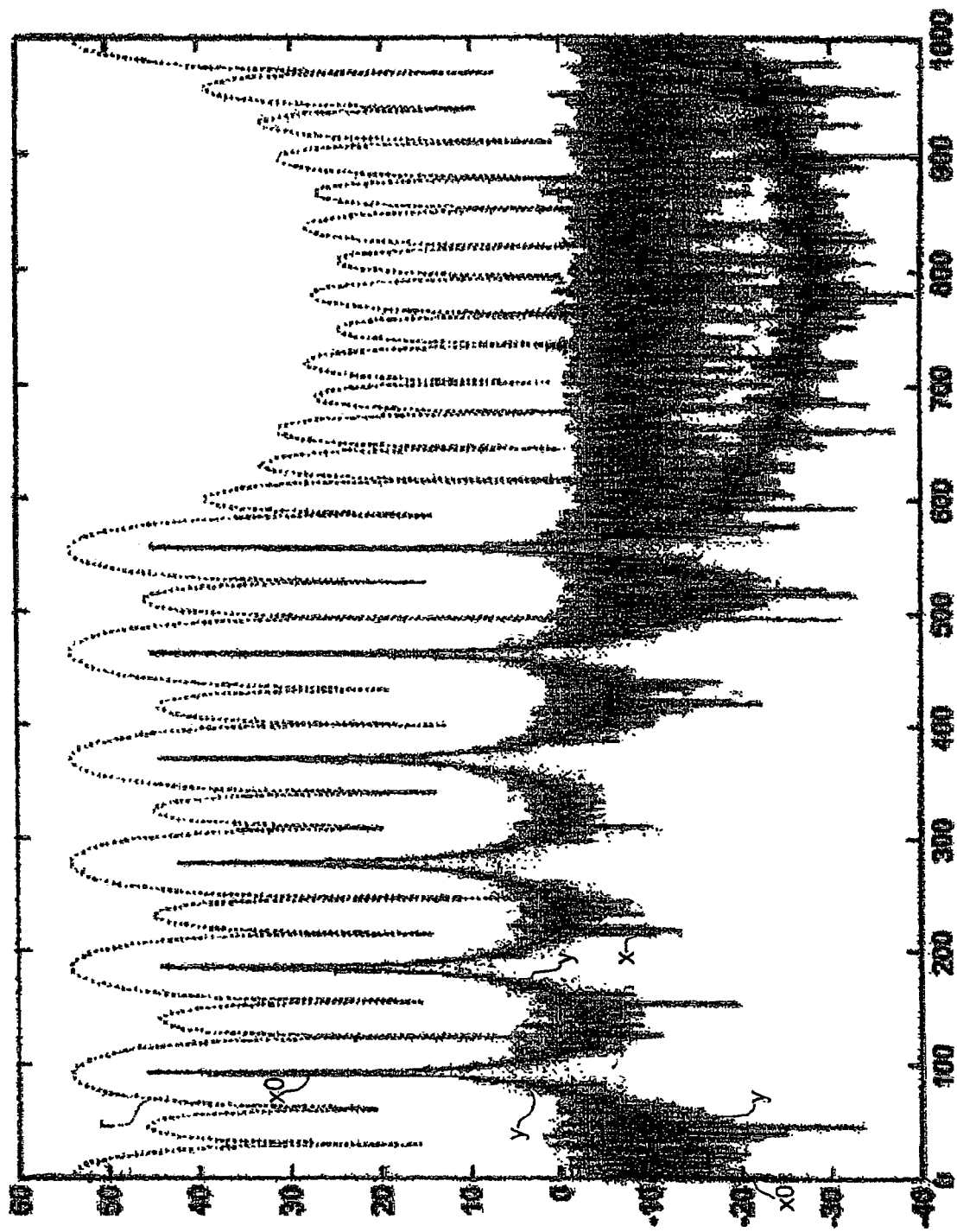
FIG. 7 is a sample frequency spectrum for a predictive filter in accordance with the embodiments of FIGS. 1-6.

FIG. 7 illustrates, for example, the input and output signal spectrum of the filter, along with the developed filter/frequency response. The input signal without interference is depicted as a continuous line x0. The sequence of input data x is superimposed on this and fluctuates in a range about the curve without interference. The outcome of the filtering, i.e., the output data y, fluctuate with less amplitude than this about the curve x0, having no interference superimposed on it. In addition, the resonator response r is illustrated by a dotted line.

As can be seen, the correction of multiple sinusoidal signal components is achieved by suppression of those frequencies in which only white noise or noncorrelated signal components are present, but not any original data with high correlation.

Although the present invention has been illustrated and described with respect to several preferred embodiments thereof, various changes, omissions and additions to the form and detail thereof, may be made therein, with departing from the spirit and scope of the invention.

What is claimed is:

1. A method of processing input data in an integrated circuit, comprising the steps performed in an integrated circuit of:
   backward-looking predictive filtering the input data using a first set of filter tap weights and providing first predictive filtered data indicative thereof;
   delaying the input data for a first time period and providing first delayed input data indicative thereof;
   forward-looking predictive filtering the first delayed input data using a second set of filter tap weights and providing second predictive filtered data indicative thereof; and
   adding the first and second predictive filtered data and providing output data indicative thereof;
   where the second set of filter tap weights is the complex-conjugate of the first set of filter tap weights.

2. The method of claim 1, further comprising the step of delaying the input data for a second time period and providing second delayed input data indicative thereof, the second time period being less than the first time period.

3. The method of claim 2, further comprising the step of determining a prediction error signal.

4. The method of claim 3, where the step of determining a prediction error signal comprises the step of subtracting a signal dependent upon the output data from the second delayed input data and providing the determined prediction error signal indicative thereof.

5. The method of claim 3, where the step of determining a prediction error signal comprises the step of subtracting the second predictive filtered data from the second delayed input data and providing the determined prediction error signal indicative thereof to the forward-looking predictive filter.

6. The method of claim 3, where the step of determining a prediction error signal comprises the step of subtracting a signal dependent upon the second predictive filtered data from the second delayed input data and providing the determined prediction error signal indicative thereof.

7. The method of claim 3, where the step of determining a prediction error signal comprises the step of subtracting the output data from the second delayed input data and providing the determined prediction error signal indicative thereof to the backward-looking predictive filter.

8. The method of claim 3, further comprising the step of providing the second delayed input to a center tap control.

9. An adaptive filter for processing a sequence of input data, comprising:
   a backward-looking predictive filter, responsive to the input data, that predictive filters the input data using a first set of filter tap weights and provides first predictive filtered data indicative thereof;
   a first delay device that delays the input data for a first period of time and provides a first delayed input data;
   a forward-looking predictive filter, responsive to the first delayed input data, that predictive filters the delayed input data using a second set of filter tap weights that are the complex-conjugate of the first set of filter tap weights, and provides second predictive filtered data indicative thereof; and
   an adder that adds the first predictive filtered data together with the second predictive filtered data and provides output data indicative thereof.

10. The adaptive filter of claim 9, further comprising a second delay device that delays the input data for a second period of time and provides second delayed input data, where the second time period is less than the first time period.

11. The adaptive filter of claim 10, further comprising a subtractor that subtracts a signal dependent upon the output signal from the second delayed input data and provides a determined prediction error signal indicative thereof.

12. The adaptive filter of claim 11, where the backward-looking predictive filter filters the input data in dependence upon the prediction error signal for adaptive control with the first set of filter tap weight, and where the forward-looking predictive filter filters the first delayed input data in dependence upon the prediction error signal for adaptive control with the second set of filter tap weights.

13. The adaptive filter of claim 10, further comprising a subtractor that subtracts the output signal from the further delayed input data and providing a determined prediction error signal indicative thereof to the backward-looking predictive filter.

14. The adaptive filter of claim 13, where the first predictive filter filters the input data in dependence upon the prediction error signal for adaptive control with the first filter tap weights, and where the second predictive filter filters the first delayed input data in dependence upon the prediction error signal for adaptive control with the second filter tap weights.

15. The adaptive filter of claim 10, further comprising a subtractor that subtracts a signal dependent upon the second predictive filtered data from the second delayed input data and provides a determined prediction error signal indicative thereof.

16. The adaptive filter of claim 10, further comprising a subtractor that subtracts the second predictive filtered data from the second delayed input data and provides a determined prediction error signal indicative thereof.

17. The adaptive filter of claim 10, further comprising a center tap control connected with the second delayed input data, where the first predictive filter filters the input data in dependence upon a prediction error signal for adaptive control with the first filter tap weights, the first filter tap weights provided to the center tap control, an output of the center tap control provided to the adder that adds the first and second predictive filtered data to the output of the center tap control.

18. An adaptive filter for processing a sequence of input data, comprising:
  a backward-looking predictive filter, responsive to the input data, that predictive filters the input data using a first set of filter tap weights and provides first predictive filtered data indicative thereof;
  a first delay device that delays the input data for a first period of time and provides a first delayed input data;
  a forward-looking predictive filter, responsive to the first delayed input data, that predictive filters the delayed input data using a second set of filter tap weights, and provides second predictive filtered data indicative thereof;
  an adder that adds the first predictive filtered data together with the second predictive filtered data and provides output data indicative thereof;
  a first difference unit that receives the first delayed input signal and the first predictive filtered data, and provides a first difference signal indicative of the difference thereof; and
  where the backward-looking predictive filter is responsive to the first difference signal.

19. The adaptive filter of claim 18, comprising:
  a second difference unit that receives the first delayed input signal and the second predictive filtered data, and provides a second difference signal indicative of the difference thereof; and
  where the forward-looking predictive filter is responsive to the second difference signal.

20. The adaptive filter of claim 18, where first difference unit also receives the second predictive filtered data, and the first difference signal is the difference between the first delayed input signal and the sum of the first and second predictive filtered data.

* * * * *